United States Patent [19]

Lanza

[11] 4,156,290

[45] May 22, 1979

[54] SPEEDUP ADDRESSING DEVICE BY DETECTING REPETITIVE ADDRESSING

[75] Inventor: Lucio Lanza, Milan, Italy

[73] Assignee: Ing. C. Olivetti & C., S.p.A., Ivrea, Italy

[21] Appl. No.: 717,954

[22] Filed: Aug. 26, 1976

[30] Foreign Application Priority Data

Dec. 31, 1975 [IT] Italy ............................... 70231 A/75

[51] Int. Cl.² ................................................ G11C 8/00
[52] U.S. Cl. ...................... 365/230; 364/200; 365/238
[58] Field of Search .................... 340/173 R; 364/200; 365/230, 238; 364/900 MS File

[56] References Cited

U.S. PATENT DOCUMENTS

| | | | |
|---|---|---|---|
| 3,618,040 | 11/1971 | Iwamoto et al. ...................... | 364/200 |
| 3,618,041 | 11/1971 | Horikoshi ............................. | 364/200 |
| 3,691,538 | 9/1972 | Haney et al. ........................... | 365/63 |

OTHER PUBLICATIONS

Beausoleil et al., "Hierarchical Storage Chip," vol. 16, No. 5 of IBM Tech. Disc. Bull., pp. 1364-1365, 10/1973.

*Primary Examiner*—Stuart N. Hecker
*Assistant Examiner*—Donald McElheny
*Attorney, Agent, or Firm*—Schuyler, Birch, Swindler, McKie & Beckett

[57] ABSTRACT

A memory addressing device for a memory divided in a plurality of elements each storing a plurality of information words. Each address for the memory comprises a first part which controls addressing means which address all the words of the memory elements stored in the address identified by said first part. All the addressed words are stored in corresponding output registers of the memory elements. The second part of the address enables the selection of the output register associated therewith. Consequently the reading operation for a block of information requires only one memory access time plus the read time of the output registers.

4 Claims, 5 Drawing Figures

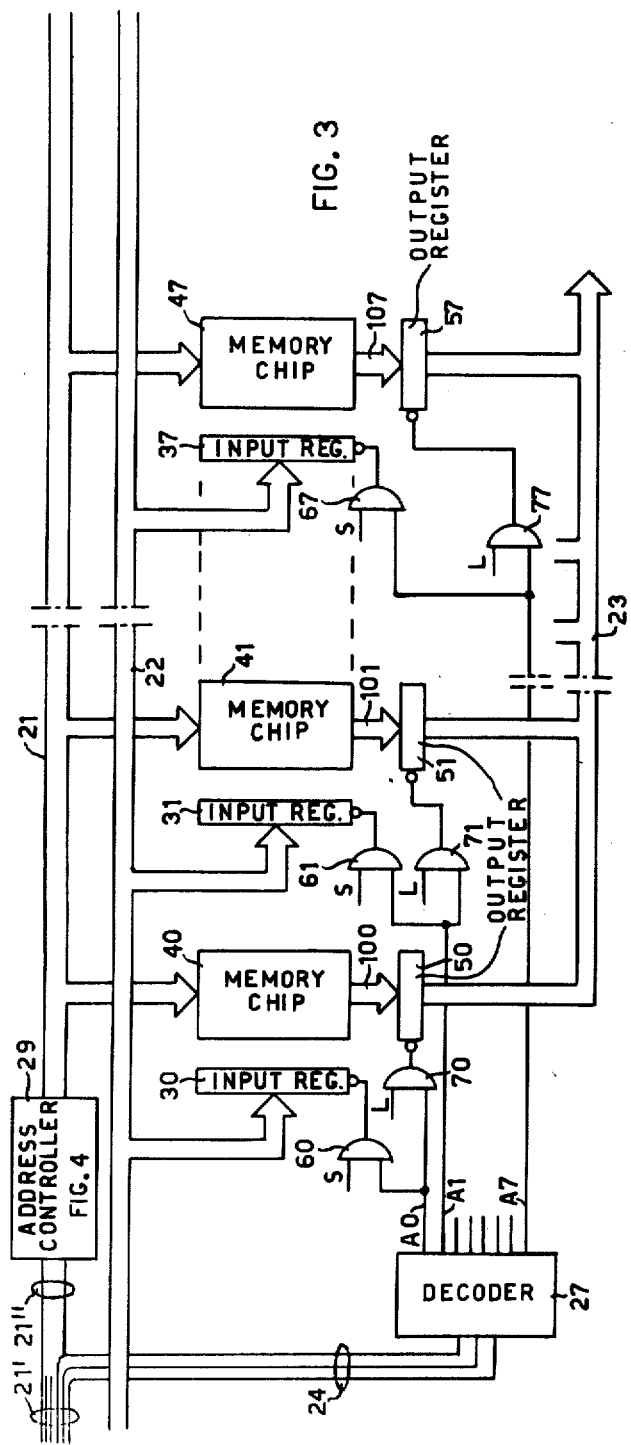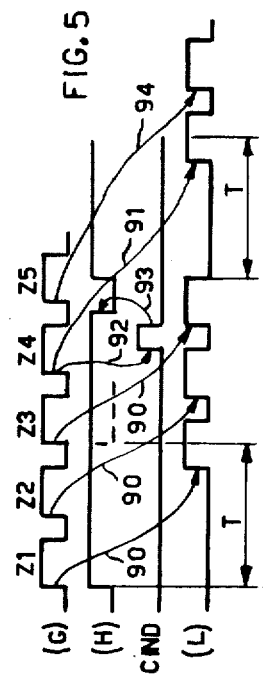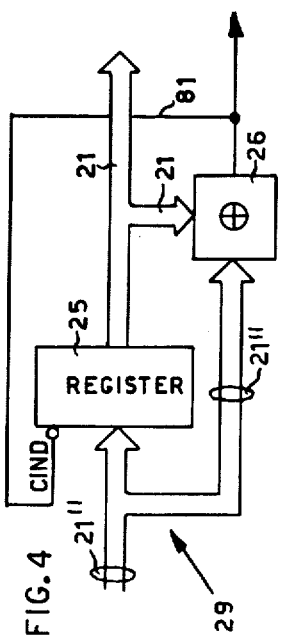

SPEEDUP ADDRESSING DEVICE BY DETECTING REPETITIVE ADDRESSING

BACKGROUND OF THE INVENTION

1. Field of the Invention

The present invention is related to a device for addressing a memory designed for digital computers. The addressing device in question may be, for example, applied to Read Only Memories (hereinafter referred to as ROM) of the Semi Conductor MOS type or to read/write memories (hereinafter referred to as RAM) of the static type.

To be more precise, said device comprises a plurality of memories with a predefined access time designed to store a plurality of data words. Furthermore the storage elements are successively addressed by a plurality of address, each of which having a first part in common and a second part which is variable; a plurality of read registers connected to storage units for writing the relative read words, the reading registers having a reading time that is considerably briefer than the access time of the memory elements and of a data output channel connected to the read registers.

2. Description of the Prior Art

There are known storage address devices, in which the first part of the address is used to select a word common to all elements (hereinafter referred to as "chip") constituting the memory. The second part of the address is decoded and provides an enabling signal containing the specific address of the chip. The reading of different words from memory results therefore in successive reading cycles.

Each read cycle includes a fixed access time and a time during which output data are valid. The major inconvenience of such a device is due to the fact that a memory access time is required for any addressing sequence. To be more precise, the length of the read cycle remains unaltered during memory access time for consecutive addressing, and this time cannot be reduced.

SUMMARY OF THE INVENTION

The object of the present invention is of providing a memory addressing device for accessing a plurality of memory addresses within a fixed period of time but utilizing a sole access time. In particular said addressing device comprises first addressing means for the simultaneous selection in all storage elements of words which are addressed by the first common part of addresses and for their transfer into said registers at the end of the access time; and second addressing means to successively command, after the time needed for reading, the transfer into the data output channel of words stored in the read register selected by the second part of the addresses. Consequently, the total time for reading the words written in the storage elements at the addresses defined in the first common part of the address is equal to the sum of a sole access time of the storage elements and of the time employed for reading the registers.

BRIEF DESCRIPTION OF THE DRAWINGS

The invention will be described in more detail, by way of example, by the following description with reference to the accompanying drawings in which:

FIG. 3 represents a block diagram of the addressing device according to the invention;

FIG. 4 represents a detail of the address control unit according to the invention;

FIG. 5 represents a timing diagram of the device shown in FIG. 3.

GENERAL DESCRIPTION

Figure 1:
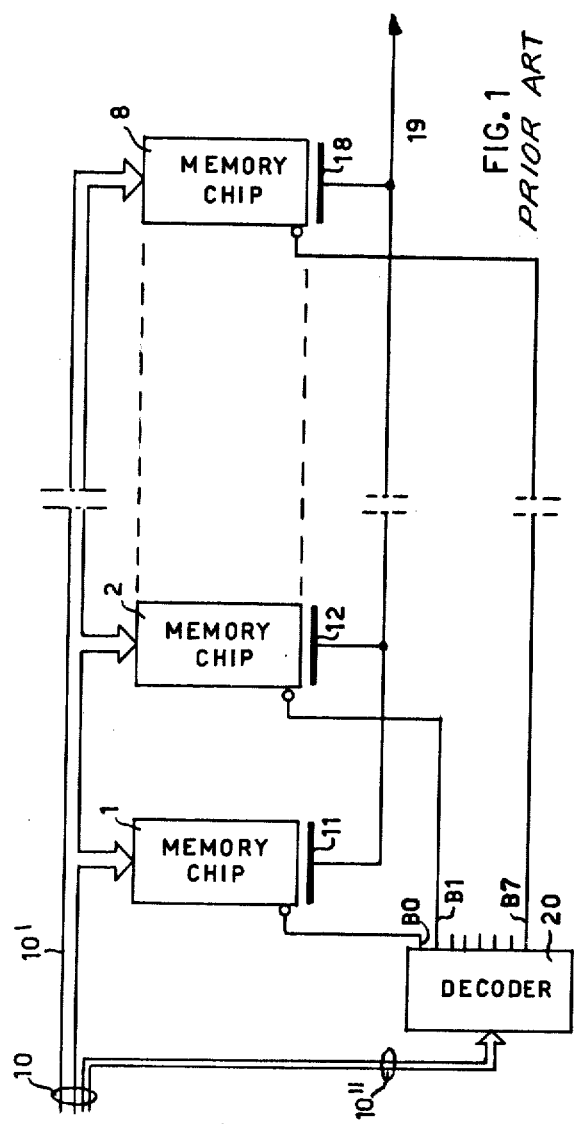
FIG. 1 shows a block diagram of an already known addressing device.
Figure 2:
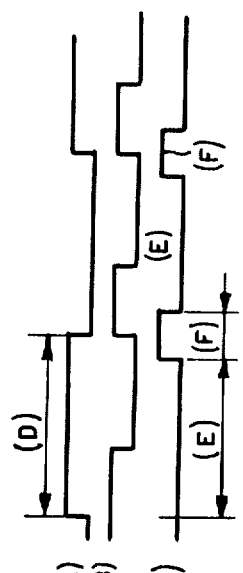
FIG. 2 shows a timing diagram (in the prior art) relating to the device of FIG. 1.

With reference to FIGS. 1 and 2, an addressing device of the prior art is now described as applied to a ROM memory. A channel 10 comprises a channel 10' and a channel 10''. Channel 10' comprises a number of conductors $N = \log_2 M$, where M is the number of words contained in a single chip (1 through 8 in FIG. 1) of the ROM. If, for example, a chip contains 1024 words of 8 bits, then the number of conductors in channel 10' would be $N = 10$. Channel 10'' includes $M' = \log_2 P$ where P is the number of chips constituting the ROM. If, for example, the ROM comprises 8 chips, then channel 10'' comprises $M' = 3$ conductors.

When there is present a current address on channel 10, the ten least significant bits are sent, via channel 10', to chips 1–8 of the ROM - while the remaining 3 most significant bits are sent via channel 10'' to decoder 20. Decoder 20, decodes the three input bits and it enables one of its B outputs (numbered zero through P-1). The decoder 20 outputs are supplied to the enabled inputs of ROM 1–8 chips. As a consequence, even if channel 10' sends the same address to all chips 1–8, only the chip enabled by decoder 20 outputs the addressed word.

If, after having read a word on channel 10, is to be read a word stored at the consecutive address of the memory, then all the above described operations are repeated. This condition is shown in the timing diagram illustrated in FIG. 2, in which diagram (A) represents the current address on channel 10. This address remains unaltered for the length of the entire read cycle indicated by (D). The diagram (B) represents the enabling signal of the memory chip sent by decoder 20. Diagram (C) represents output data The time (E) represents the ROM access time and the time (F) is the duration of data output validity on channel 19.

As it may be seen in FIG. 2, output data on channel 19 are available every (E) units of time independently of the location of the cell corresponding to the address. Each single byte output by the ROM thus requires said time period, whereby the time for reading a sequence of bytes is the sum of the time periods needed for reading each byte.

The following detailed description referred to FIGS. 3, 4 and 5 is now given as an example of the device according to the invention.

FIG. 3 relates to a RAM memory of the static type. To be more precise, this kind of memory has the property that the reading of a word does not destroy the read data and consequently there is no need to rewrite said data. The elements of a circuit 40–47 (hereinafter named chips) which constitute the memory are of the semiconductor (MOS) type. These chips have, for example, a 1024-8-bit-word capacity and are connected to an address channel 21 comprising ten bits.

Channel 21 stores the most significant 10 bits of the address and is connected to the address controller 29, shown in detail in FIG. 4.

The address controller 29 is connected to the address channel 21' having a 13-bit capacity via channel 21''. Address channel 21' is also connected to an address channel 24, which holds the three least significant bits of the current address.

Channel 24 is connected to the input of decoder 27 which supplies eight output enabling signals A0 through A7. These are respectively supplied to the first inputs of the AND circuits 60–67 and 70–77. The second inputs of the AND circuits 60–67 are supplied with the signal S generated by the CPU (not shown in the figures) together with the current address on channel 21'. The signal S, together with one of the signals A0–A7 enables one of the AND circuits 60–67. The outputs of AND 60–67 are respectively connected to the enabling input of registers 30–37. Registers 30–37 connect to channel 22 which sends data coming from the central unit and which are to be written in the RAM. Of course the signal S is generated only when information are to be written in the RAM and consequently only when channel 22 stores the data to be loaded in registers 30–37.

The second inputs of AND 70–77 is supplied with signal L coming by the central unit (CPU) together with the current address on channel 21'. Signal L together with one of the signals A0–A7 enables one of the AND 70–77. The outputs of AND 70–77 are respectively connected to the enabling inputs of registers 50–57 which are used to store data read from the respective chips of RAM 40–47. The outputs of registers 50–57 are connected to channel 23. Channel 23 sends towards the central unit (CPU) the data stored in a register comprised in the group of registers 50–57, which is enabled by one of the AND 70–77.

Referring to FIG. 4 the address controller 29 is now described which constitutes one of the improvements of the current invention.

The controller 29 comprises a staticizer register 25, the output of which stores the most significant part of the current address stored on channel 21''. Channel 21'' is also connected to the input of the address comparison circuit 26. The output of register 25 comprises channel 21 as above mentioned and it is connected to the input of the RAM 40–47 chips. Channel 21 is also connected to the second input of the address of comparison circuit 26. Comparison circuit 26 comprises as many OR EXCLUSIVE circuits (not shown in FIG. 4) as there are conductors comprised in channels 21 and 21''. The output of said OR EXCLUSIVE circuits are connected to the input of an OR circuit, the output of which is conductor 81.

Consequently, this conductor carries the CIND signal to a logic level 1 if and only if the configurations of the current signals on channels 21 and 21'' are different.

For instance, if there it is stored on channel 21 a current address 000 010 0011 simultaneously with a current address 000 000 0011 on channel 21'', then the CIND signal is at logic level 1. CIND=1 indicates that the new address coming from the central unit and currently on channel 21'' is different from the address of the previous memory cycle currently on channel 21. The signal CIND generated from the comparison address circuit 26 is applied to the enabling input of register 25. Consequently, if the new address coming from channel 21'' differs from the current address on channel 21 (corresponding to the address written in register 25) then the CIND signal enables the writing in register 25 of the new current address stored on channel 21''. Data written in register 25 is always current on channel 21, consequently the new address is also written on channel 21.

It is to be pointed out the fact that only the most significant part of the address (coming from channel 21') is always current on channels 21 and 21'' (10 bits in our example). Consequently, when the signal CIND is at logic level "1", this indicates that the most significant part of the current address on channel 21'' differs from the most significant part of the current address on channel 21.

MEMORY READING

Chips 40–47, as already mentioned above, are of the static type. This means that when a current address is stored on channel 21, and the read command L is at level "1", then all chips 40–47 supply the stored word in the associated address to the corresponding data output 100–107. If for example the binary address 000 010 011.1 is currently on channel 21 (that is "39" in decimal notation) then the stored words written in the fortieth cell (the first cell corresponds to the zero address) of all the chips 40–47 are read and written in registers 50–57. All the registers 50–57 are then automatically loaded with the words read from chips 40–47 which are addressed by the corresponding part of the current address on channel 21.

Furthermore, it is important to remember that registers 50–57 contain the addressed word in channel 21 for the whole time duration, in which the address is stored on channel 21. This means that as long as a different address does not arrive on channel 21, registers 50–57 will contain the byte stored at the specific address of the channel 21.

In the example cited above, in which channel 21 supplies the decimal address "39", the fortieth cell of chips 40–47 is then read and transferred to registers 50–57. In this instance, the words read from the actual registers 50–57 are stored in registers 50–57 as shown on the following table.

| Ref. FIG. 5 | Channel 21 | Channel 24 | Actual Address | Data Register |
|---|---|---|---|---|
| — | 000 010 011 1 | 000 | 312 | 50 |
| Z 1 | " | 001 | 313 | 51 |
|  | " | 010 | 314 | 52 |
| Z 3 | " | 011 | 315 | 53 |
|  | " | 100 | 316 | 54 |
|  | " | 101 | 317 | 55 |
|  | " | 110 | 318 | 56 |
| Z 2 | " | 111 | 319 | 57 |

Decoder 27 selects the word to be sent to the central unit via channel 23 by decoding the three least significant bits of the current address on channel 24. If, for example, channel 24 contains the binary configuration "001", then signal A1 is generated and input to AND-71 together with the read command L. Register 51 is enabled and the byte written in said register is sent to the central unit (CPU) via channel 23. The said byte corresponds to memory address 313.

It is assumed that address 313 above used, corresponds to the address Z1 shown in diagram (G) of FIG. 5. Diagram (L) of FIG. 5 shows data output from registers 50–57, and as may be seen from the arrow 90, the data on channel 23 are current T m sec after the rising edge of address Z1. Let us now assume that immediately after Z1=313 address Z2=319 is current on channel 21. As shown in table 1, said address does not alter the current bit configuration on channel 21.

In fact, since the same bit configuration is stored on both channels 21" and 21, the address comparison 26 (FIG. 4) does not generate the CIND change address signal and consequently the address on channel 21 is confirmated. On the contrary, decoder 27 inputs bit configuration 111 and generates signal A7. The A7 signal together with the read command L is applied to AND 77, which enables the reading of the word stored in register 57. The word written at the actual address 319 being already current in register 57 is then immediately transferred to the output data channel 23.

According to what has heretofore been mentioned, it is clear that reading whichever word that follows the first word stored at the addresses shown in table 1 occurs with a delay corresponding to the recovering time of decoder 27. Said time corresponds approximately to the Switch time of a flip-flop consequently being very brief if compared with the storage cycle access time T. Similarly, if whatever address Z3 (for example, address 315) following address Z2 and included in the eight addresses of table 1, is requested to be read the current of the cell addressed by said address is read with a delay of approximately a few nonoseconds (approximately 50 nanoseconds) and not with a delay corresponding to a storage cycle (from 500 to 1000 nanoseconds). There is no doubt that what has been illustrated in table 1 with regards to the current address 000 010 011 1 on channel 21, is valid for whatever address may occur between 000 000 000 0 and 111 111 111 1.

In fact, let us now suppose that address Z4 of FIG. 5 would change the signal configuration on channel 21".

The comparison circuit 26 receives the new configuration on channel 21" and compares it to the preceding existing configuration on channel 21. As the result is diversity in the configuration, it generates a CIND signal on wire 21. The CIND signal (see diagram in FIG. 5) enables register 25 to write the new configuration of the current signals on channel 21. Consequently the new code configuration is current on channel 21 as well and at the end of the storage cycle T shown in FIG. 5 the words read are loaded from chips 40–47. Arrows 91, 92 and 93 shown in FIG. 5 illustrate what has been heretofore described. FIG. 5 illustrates that the CIND change of address signal (arrow 92) being generated is caused because address 24 differs from address 23 in the configuration of the bits in channel 21. The signal CIND causes the new address to be written in channel 21 (arrow 93) which, after a memory cycle T supplies, the output data on registers 50–57. Consequently, the stored word associated to the new current address on channel 21 is available T units of time after the data associated with address Z3.

Lastly, if the new address Z5 belongs to the set of addresses which would not change the configuration of channel 21, then the data are immediately available as shown by arrow 94 of FIG. 5.

According to what has been described heretofore, there is no doubt about how the storage address system according to the invention, simultaneously reads a plurality of words from a plurality of storage elements and transfers them to a corresponding plurality of registers 50–57. These registers thus contain words belonging to contiguous addresses constituting a predefined set, depending on the number of elements composing the memory.

When a new address, belonging to said set appears on channel 21', the called word is already available in one of the registers 50–57. The relevant word is then transferred to data output channel 23 in a time equal to the read time of registers 50–57.

MEMORY WRITINGS

The device according to the invention is capable of writing data in the memory at about the same speed as the data are read from said memory. This is possible due to the fact that, while the reading operation is performed in parallel on all chips 40–47, on arrival of a part of the current address on channel 21, writing is commanded singularly for each chip by activating one of the data input registers 36–37 via signal S and one of signals A0 through A7. Consequently, in the environment of the set of address selected by the part of address stored on channel 21, each reading and/or writing cycle has a duration equal to the time needed to activate one of the data output registers 50–57 or to the activation of the data input registers 30–37. Thus while a write register belonging to registers 30–37 is writing in the corresponding chip belonging to storage elements 40–47, another write register which is different from the previous one may also initiate a write cycle thus overlapping the preceding cycle. Therefore if, for example, consecutive addresses have a common part of the address on channel 21', then data on channel 22 may be sent at intervals of time equal to loading time of registers 30–37.

As has been said heretofore, this is possible since the signal generated by AND 60–67, activates loading of the register associated with it as well as writing, in memory, of the word stored in such a register in a manner independent of the remaining memory elements.

As a consequence, since the write cycle of elements 40–47 may overlap, the set of addresses indicated by that part of the current address on channel 21 may be written in a minimal period of time equal to the sum of the loading times of registers 30–37.

It is finally pointed out how, in the environment of a set of addresses defined by that part of the current address on channel 21, write and read cycles may be freely mixed. The only limit is imposed by the waiting period needed for the read operation of the last write cycle in course. This is so since it is obviously impossible for a write cycle to overlap a read cycle.

FIG. 3 gives an example of an application of all the configurations which become available by the association of a plurality of 40–47 type of memory chips between themselves alternatively by different bit capacities. Another example of an application may be achieved through the association of two chips of the type illustrated in FIG. 3 in such a way as to obtain 16 bit words. In this instance, the signal output from each of the AND 70–77 is sent to a pair of 50–57 type read registers.

Similarly, the signal output from AND 60–67 is sent to a pair of 30–37 type write registers connected to 2 contiguous 40–47 type chips.

There is no doubt that also the total number of words composing the address set may be varied through modifying decoder 27. A set of 16 addresses may be obtained by decoding the 4 least significant bits of the address by means of a 4-per-16 decoder.

It is understood that the invention is not only limited to the particular embodiment which has been heretofore chosen for the purposes of the relevant application, with reference to the accompanying drawings, but through the use of the invention all available modes of applications may be applied, the claims of which remain with the inclusion of the variants, improvements, addition of parts and any other modification of the detail of its design.

I claim:

1. An addressing device for a memory having a plurality of elements connected to a common parallel data output channel and each requiring a predetermined access time addressable by a plurality of addresses received on an address channel, each address having a first common part and a second variable part, said memory comprising separate read and write data registers associated with each memory element, said read registers having their inputs connected to said memory elements for storing the words read from said memory elements and having their outputs connected to a data output channel, said registers having a read time less than said memory access time,
- first addressing means having an input coupled to a portion of said address channel carrying said first common part of said addresses, for simultaneously selecting in all said memory elements the words addressed by said first common part of said addresses,
- means coupled to an output of said first addressing means for transferring said read words into said read registers after said selection,
- address control means coupled to said portion of said address channel and to the output of said first addressing means for checking the equality of two successive occurrences of said first common address part,
- second addressing means for successively controlling the transfer on said data output channel of the words stored in any one of the read registers selected by said second part of said addresses, whereby the read time for the words stored in said memory elements at the addresses identified by said first common part is no greater than the sum of a single memory access time and the read operation time of said selected registers.

2. A memory addressing device as claimed in claim 1, wherein said first addressing means comprise an address register for storing said address common part, and said address control means comprise a comparing circuit for comparing the addresses stored in said address register and received on said address channel portion and for generating an enabling signal for said address register when a dissimilarity is detected, the content of said address register being changed to store the common address part on said input channel portion in response to said enabling signal.

3. An addressing device for a memory having a plurality of elements, each said memory element being connected to a common parallel data input channel and requiring a predetermined access time for writing therein an information word, said memory elements being addressable by addresses received on an address channel, each said address having a first common part and a second variable part, said memory comprising separate data registers connecting each said memory element with the common data input channel, said write registers storing an information word in a load period operation time that is shorter than said memory access time,
- first addressing having an input coupled to a portion of said address channel carrying said first common part of said addresses, for simultaneously selecting in all said memory elements the locations addressed by said first common part of said addresses,
- address control means coupled to an output of said first addressing means for checking the equality of two successive occurrences of said common address,
- second addressing means coupled to said write registers to command the successive loading of said write register and the writing of the associated memory elements identified by said second part of said addresses, whereby the write operation time of the memory elements at the addresses defined by said successive occurrences of the same first common part is equal to the sum of the loading times of said write registers identified by said second variable address parts associated with the successive occurrences of the first common part.

4. Memory addressing device as claimed in claim 3 wherein said second addressing means comprises a decoder for decoding said second part of said address, a third addressing channel connected to said decoder, first gate means connected to the output of said decoder and controlled by a read command for selectively activating one of said read registers at each variation of said second part of said address, and second gate means connected to the output of said decoder and controlled by a write command for selectively activating said write registers at each variation of the addressed one of said second part of said address.

* * * * *